United States Patent
Kuhara et al.

(10) Patent No.: US 7,514,929 B2
(45) Date of Patent: Apr. 7, 2009

(54) MAGNETIC RESONANCE IMAGING APPARATUS AND STATIC MAGNETIC FIELD CORRECTION METHOD

(75) Inventors: Shigehide Kuhara, Otawara (JP); Hirofumi Anno, Toyoake (JP); Masato Ikedo, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 0 days.

(21) Appl. No.: 11/653,430

(22) Filed: Jan. 16, 2007

(65) Prior Publication Data

US 2007/0164744 A1 Jul. 19, 2007

(30) Foreign Application Priority Data

Jan. 16, 2006 (JP) ............................. 2006-007911

(51) Int. Cl.
*G01V 3/00* (2006.01)
(52) U.S. Cl. ....................................... 324/320; 324/309
(58) Field of Classification Search ................. 324/320, 324/319, 309, 307
See application file for complete search history.

(56) References Cited

U.S. PATENT DOCUMENTS

| | | | | |
|---|---|---|---|---|
| 4,720,679 | A * | 1/1988 | Patrick et al. | 324/309 |
| 4,761,614 | A * | 8/1988 | Prammer et al. | 324/320 |
| 5,617,029 | A * | 4/1997 | Schneider | 324/320 |
| 6,509,735 | B2 * | 1/2003 | Mueller et al. | 324/307 |
| 7,292,034 | B2 * | 11/2007 | Hennig et al. | 324/309 |

FOREIGN PATENT DOCUMENTS

| | | |
|---|---|---|
| JP | 4-246329 | 9/1992 |
| JP | 7-39538 A | 2/1995 |
| JP | 3237964 | 10/2001 |

OTHER PUBLICATIONS

U.S. Appl. No. 11/404,840, filed Apr. 2006, Ikedo et al.
European Search Report mailed May 8, 2007, in corresponding European Application No. 07000708.3.
Dong-Hyun Kim et al., "Regularized Higher-Order In Vivo Shimming," Magnetic Resonance in Medicine, Academic Press, Duluth, MN, vol. 48, 2002, pp. 715-722, XP-002325834.
H. P. Hetherington et al., "An Automated Shim Mapping Method for Spectroscopic Imaging of the Human Hippocampus," Proc. Intl. Soc. Mag. Reson. Med., 13, 2005, p. 730, XP-002430216.
M. Schar et al., "Considerations on Shimming for Cardiac Applications at 1.5 and 3.0T," Proc. Intl. Soc. Mag. Reson. Med. 11, 2003, p. 174, XP-002294865.

(Continued)

*Primary Examiner*—Louis M Arana
(74) *Attorney, Agent, or Firm*—Nixon & Vanderhye PC

(57) ABSTRACT

A magnetic resonance imaging apparatus includes a collector which collects magnetic resonance signals emitted from a region of interest of a subject, and a correction magnetic field generator which generates a correction magnetic field to correct the nonuniformity of a static magnetic field on the basis of magnetic resonance signals which are contained in the magnetic resonance signals collected by the collector, are emitted from a specific region which forms a portion of the region of interest.

15 Claims, 9 Drawing Sheets

OTHER PUBLICATIONS

James Wilson et al., "Fast, Fully Automated Global and Local Shimming of the Human Brain," Proc. Intl. Soc. Mag. Reson. Med 9, 2001, p. 1230, XP-002430217.

Peter Webb et al., "Rapid, Fully Automatic, Arbitrary-Volume in Vivo Shimming," Magnetic Resonance in Medicine, Academic Press, Duluth, MN, vol. 20, No. 1, Jul. 1, 1991, pp. 113-122, XP-000219240.

Philips: Intera Application Guide, vol. 1: Basics, 2001, pp. 117-120, XP-002430218.

Rolf Gruetter et al., "Field Mapping Without Reference Scan Using Asymmetric Echo-Planar Techniques," Magnetic Resonance in Medicine, Academic Press, Duluth, MN, vol. 43, 2000, pp. 319-323, XP002294864.

* cited by examiner

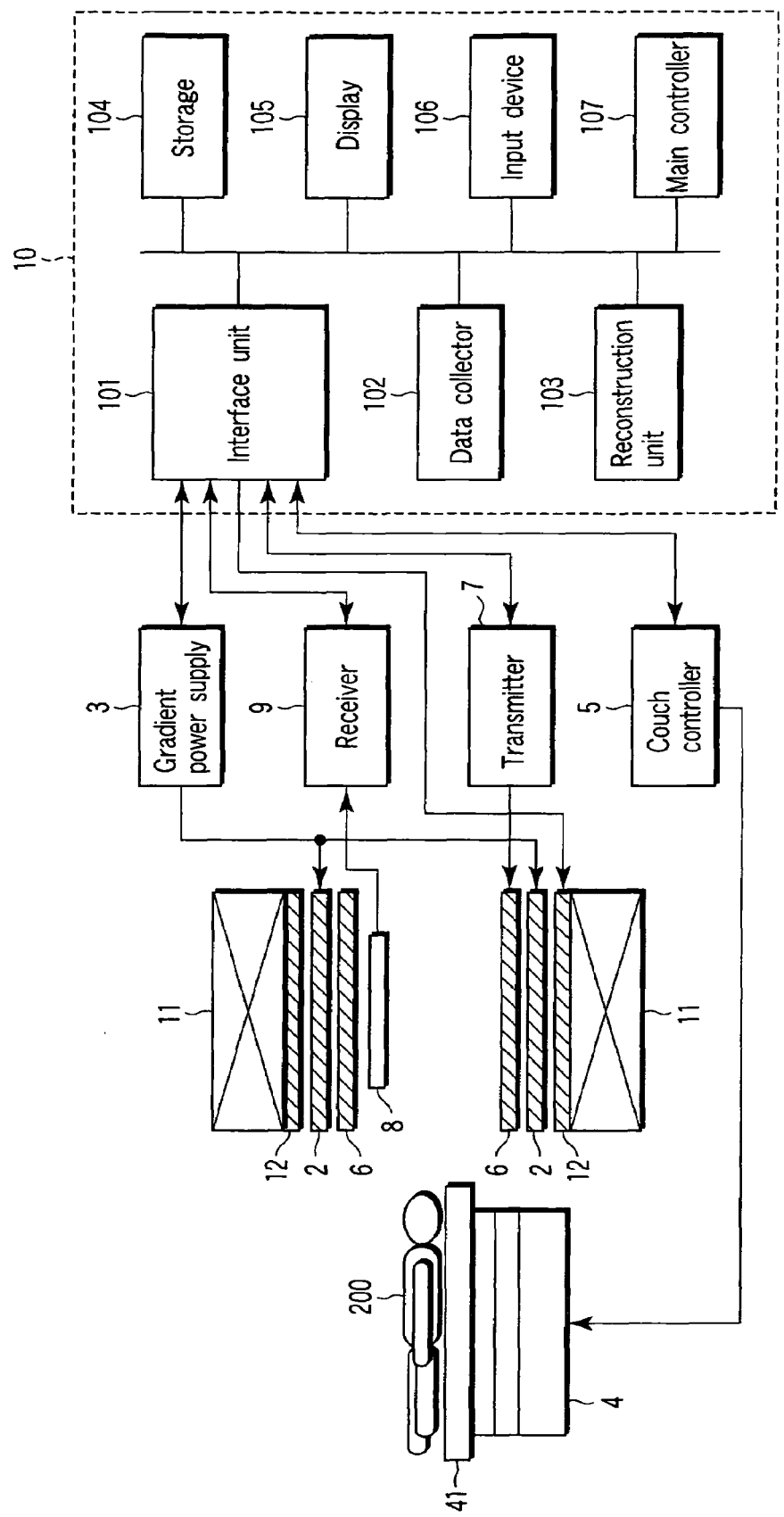
F I G. 1

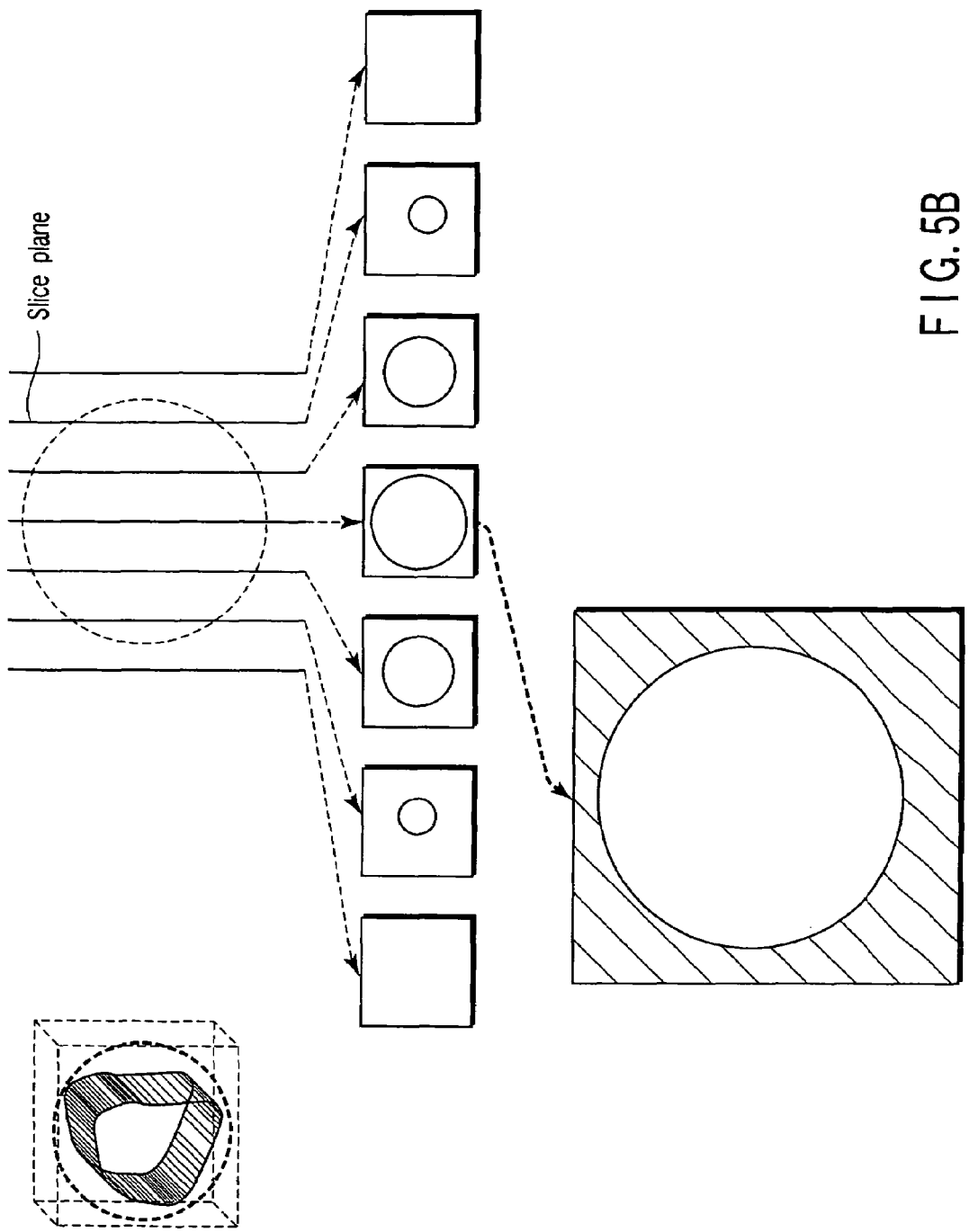

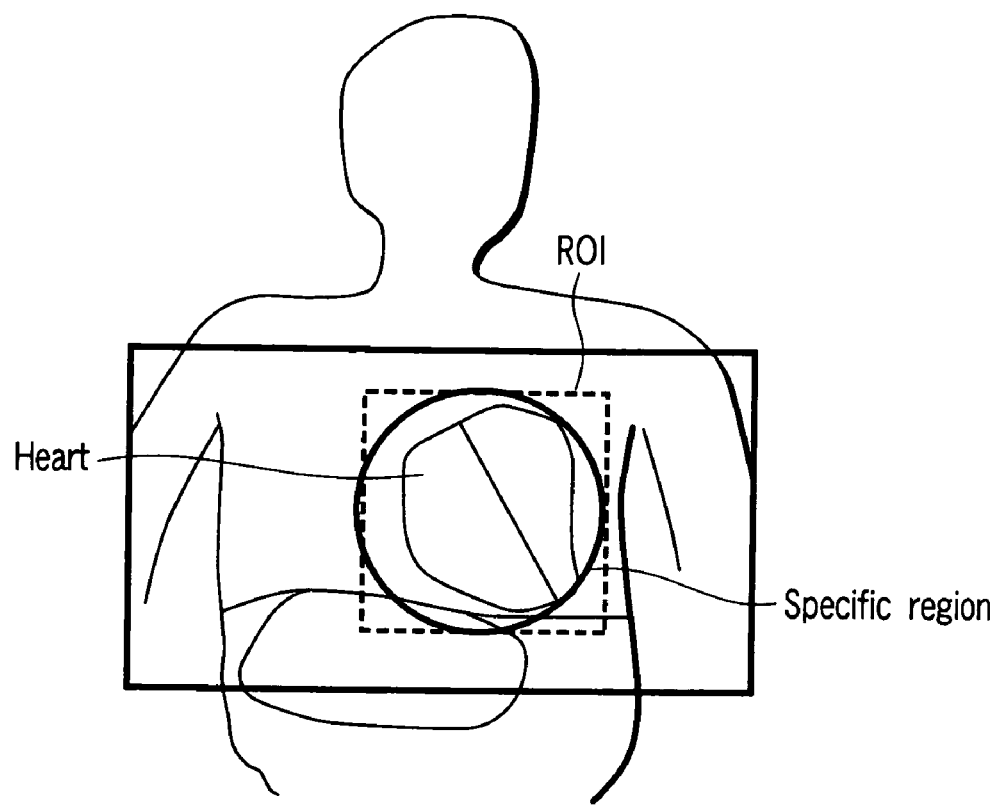
F I G. 6A
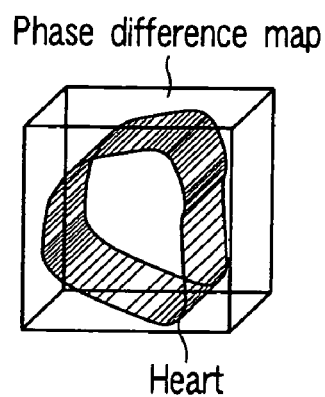
F I G. 6B

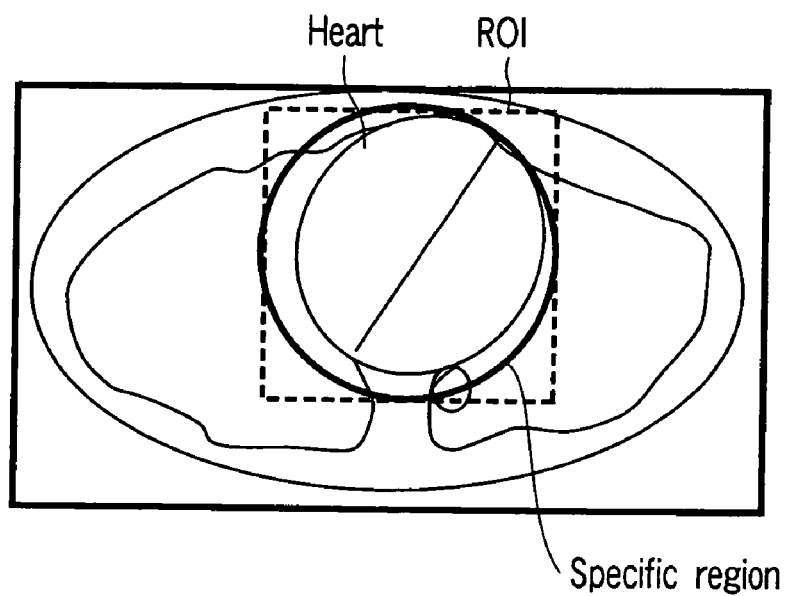
F I G. 7A
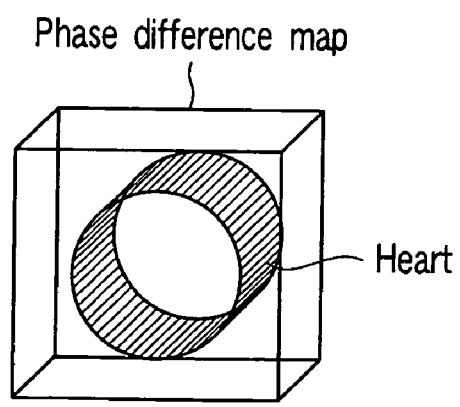
F I G. 7B

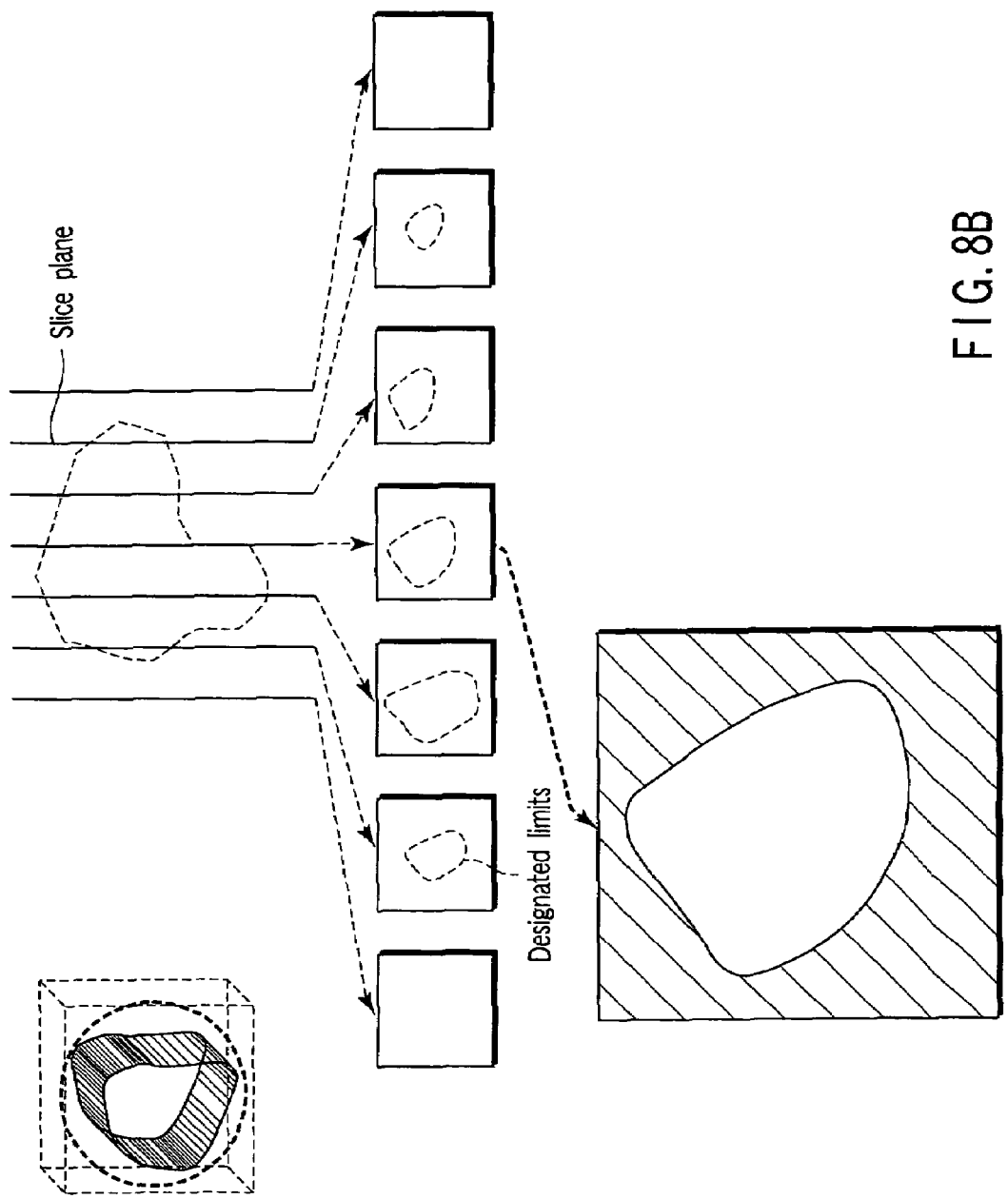

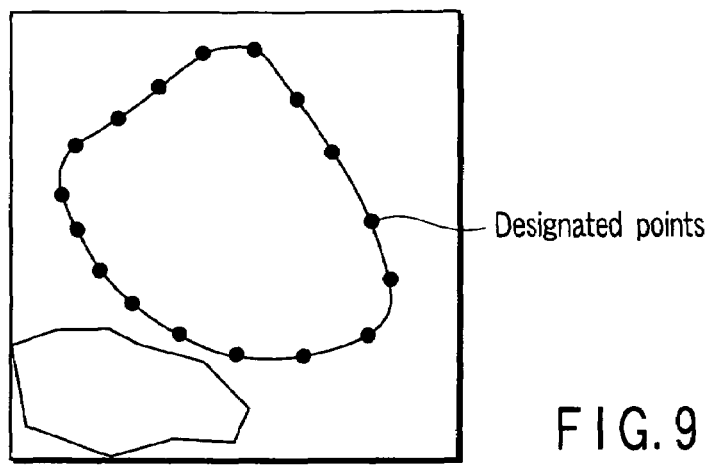
F I G. 9
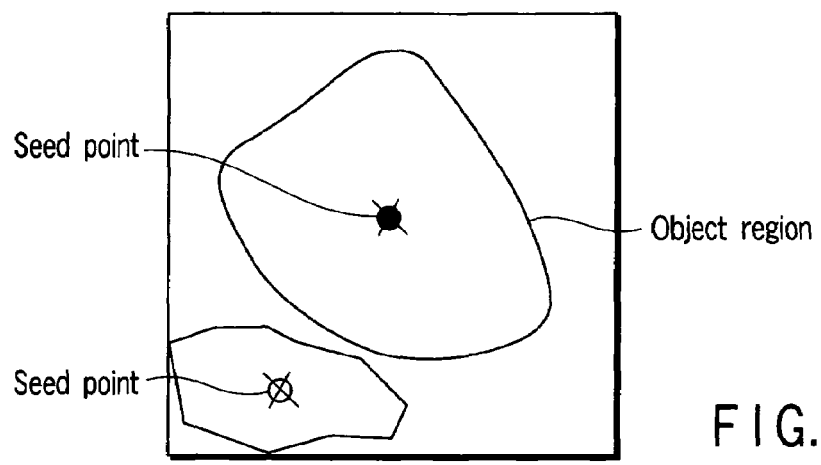
F I G. 10A
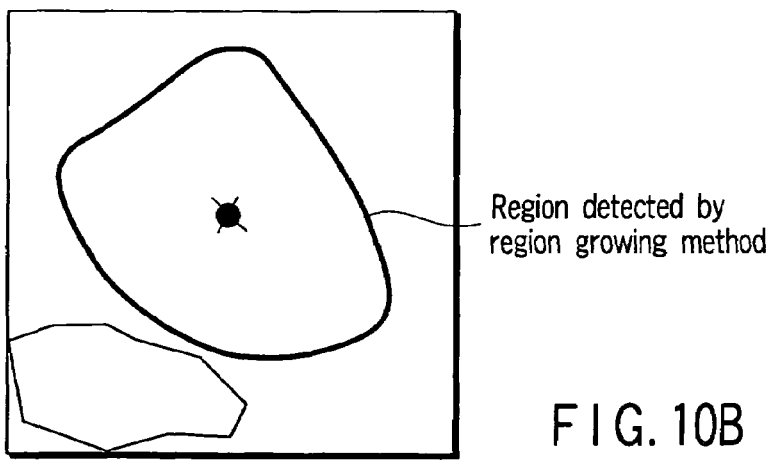
F I G. 10B

MAGNETIC RESONANCE IMAGING APPARATUS AND STATIC MAGNETIC FIELD CORRECTION METHOD

CROSS-REFERENCE TO RELATED APPLICATIONS

This application is based upon and claims the benefit of priority from prior Japanese Patent Application No. 2006-007911, filed Jan. 16, 2006, the entire contents of which are incorporated herein by reference.

BACKGROUND OF THE INVENTION

1. Field of the Invention

The present invention relates to a magnetic resonance imaging (MRI) apparatus and a static magnetic field correction method and more specifically to a technique to adjust the nonuniformity of a static magnetic field which is caused by a patient.

2. Description of the Related Art

With conventional MRI apparatus, to adjust the uniformity of a static magnetic field which varies from patient to patient, a technique called shimming is carried out. This technique usually involves collecting data reflecting the influence of a static magnetic field, then calculating the amount of correction of the static magnetic field on the basis of that data, determining a value of current corresponding to the amount of correction, and supplying a current of that value to a correction coil.

Typically, the collection of data reflecting the influence of a static magnetic field is carried out on a region of a sufficient size to accommodate a patient. In that case, however, data from regions which are not intended for diagnostic purposes will be contained. If the distribution of strength of a static magnetic field within such regions greatly varies from that within a region to be diagnosed (an imaging region), the proper amount of correction cannot be calculated in some cases. For instance, the heart portion and the breast wall portion greatly vary in the static magnetic field conditions in many cases. When data from these portions are mixed, therefore, errors will arise in the calculated amount of correction, which may result in a failure to make the optimum magnetic field adjustment.

To solve such a problem, a method has been proposed which calculates the amount of correction on the basis of data collected from only the inside of a region of interest (ROI) which is set limited to the surrounding of a region for which an imaging diagnosis is to be made. This method is called local shimming. However, in order to correctly collect data concerning an imaging region, it is required to set a region including the surroundings of the imaging region as the ROI. That is, the ROI has to be made sufficiently larger than the imaging region. For this reason, data from the ROI will contain data from other regions than the imaging region, which may result in a failure to calculate the proper amount of correction.

A technique to adjust a static magnetic field according to the location or size of an imaging region has also been proposed (see, for example, Japanese Patent No. 3237964).

With the conventional MRI apparatus, as described above, difficulties are involved in calculating the proper amount of correction and consequently the static magnetic field within an imaging region cannot be adjusted properly.

BRIEF SUMMARY OF THE INVENTION

In view of such situations, the demand has increased for developing a technique to allow the static magnetic field within an imaging region to be properly adjusted.

According to a first aspect of the present invention, there is provided a magnetic resonance imaging apparatus comprising: a collector which collects magnetic resonance signals emitted from a region of interest of a subject; and a correction magnetic field generator which generates a correction magnetic field to correct the nonuniformity of a static magnetic field on the basis of magnetic resonance signals which are contained in the magnetic resonance signals collected by the collector, are emitted from a specific region which forms a portion of the region of interest.

According to a second aspect of the present invention, there is provided a magnetic resonance imaging apparatus comprising: a shim coil to correct the nonuniformity of a static magnetic field; a setup unit which sets up a three-dimensional region within the static magnetic field; a measurement unit which measures the distribution of strength of the static magnetic field within the three-dimensional region set up by the setup unit; and a calculation unit which calculates a value of current to be applied to the shim coil to correct the nonuniformity of the static magnetic field in accordance with the magnetic field distribution, of the magnetic field distribution measured by the measurement unit, within a spherical, elliptical or combined ellipsoid region contained in the three-dimensional region.

According to a third aspect of the present invention, there is provided a magnetic resonance imaging apparatus comprising: a measurement unit which measures the distribution of strength of a static magnetic field; an extraction unit which extracts the distribution of strength of the static magnetic field within a spherical, elliptical or combined ellipsoid region from the static magnetic field distribution measured by the measurement unit; and a shimming unit which carries out shimming to increase the uniformity of the static magnetic field in accordance with the magnetic field distribution extracted by the extraction unit.

According to a fourth aspect of the present invention, there is provided a method of correcting a static magnetic field comprising the steps of: collecting magnetic resonance signals emitted from a region of interest of a subject; and generating a correction magnetic field to correct the nonuniformity of the static magnetic field on the basis of magnetic resonance signals which are contained in the collected magnetic resonance signals, are emitted from a specific region which forms a portion of the region of interest.

According to a fifth aspect of the present invention, there is provided a method of correcting a static magnetic field comprising the steps of: setting up a three-dimensional region within the static magnetic field; measuring the distribution of strength of the static magnetic field within the three-dimensional region; and calculating a value of current to be applied to the shim coil to correct the nonuniformity of the static magnetic field in accordance with the magnetic field distribution, of the measured magnetic field distribution, within a spherical or elliptical region contained in the three-dimensional region.

According to a sixth aspect of the present invention, there is provided a method of correcting a static magnetic field comprising the steps of: measuring the distribution of strength of the static magnetic field; extracting the distribution of strength of the static magnetic field within a spherical or elliptical region from the measured static magnetic field distribution; and performing shimming to increase the uniformity of the static magnetic field in accordance with the extracted magnetic field distribution within the spherical or elliptical region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the preferred embodiments given below, serve to explain the principles of the invention.

FIG. 1 shows the configuration of an MRI apparatus according to an embodiment of the present invention;

FIGS. 5A and 5B are diagrams for use in explanation of the specific region set up in accordance with the first method;

FIGS. 6A and 6B are diagrams for use in explanation of a modification of the first method;

FIGS. 7A and 7B are diagrams for use in explanation of a modification of the first method;

FIGS. 8A and 8B are diagrams for use in explanation of a second method to set up a specific region;

FIG. 9 is a diagram for use in explanation of a third method to set up a specific region; and FIGS. 10A and 10B are diagrams for use in explanation of a fourth method to set up a specific region.

DETAILED DESCRIPTION OF THE INVENTION

Figure 2:
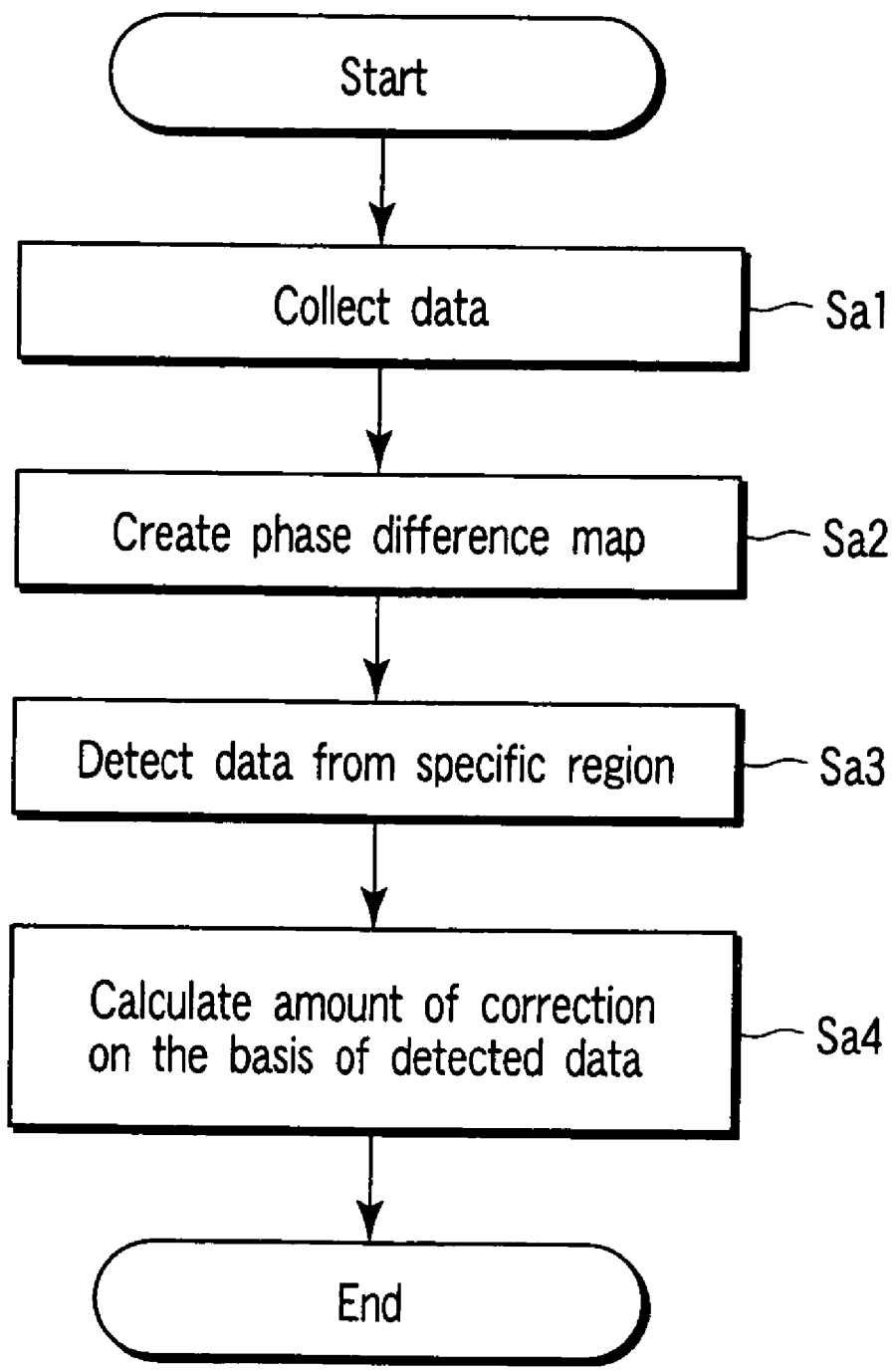
FIG. 2 is a flowchart for the calculation of an amount of correction by the controller in FIG. 1.

An embodiment of the present invention will be described hereinafter with reference to the accompanying drawings.

FIG. 1 shows the configuration of an MRI apparatus according to this embodiment. This MRI apparatus includes a static field magnet unit 1, a gradient coil 2, a gradient power supply 3, a couch 4, a couch controller 5, a transmission RF coil 6, a transmitter 7, a receiving RF coil 8, a receiver 9, and a computer system 10.

The static field magnet unit 1 is formed in the shape of a hollow cylinder and adapted to generate a uniform static magnetic field within its inside space. The static field magnet unit 1 includes a static field magnet 11 and a correction coil 12. The static field magnet 11 is a permanent magnet or a superconductive magnet. The correction coil 12 is a combination of two or more coils. The correction coil 12 generates a correction magnetic field to correct the nonuniformity of the static magnetic field generated by the static field magnet 11.

The gradient coil 2 is formed in the shape of a hollow cylinder and placed inside the static field magnet unit 1. The gradient coil 2 is a combination of three coils each corresponding to a respective one of the three mutually orthogonal X, Y and Z axes. When the three coils are individually supplied with current from the gradient power supply 3, the gradient coil 2 generates gradient magnetic fields each of which has its strength varied along a corresponding one of the X, Y and Z axes. Suppose here that the Z-axis direction coincides with the direction of static magnetic field. The gradient magnetic fields in the X, Y and Z-axis directions are used as a slice selection gradient magnetic field Gs, a phase encoding gradient magnetic field Ge, and a readout gradient magnetic field Gr, respectively. The slice selecting gradient magnetic field Gs is used to arbitrarily determine a plane section to be photographed. The phase encoding gradient magnetic field Ge is used to change the phase of magnetic resonance signals according to spatial location. The readout gradient magnetic field Gr is used to change the frequency of magnetic resonance signals according to spatial location.

A subject under examination 200 is laid down on the top board 41 of the couch 4 and moved into the space of the gradient coil 2 (photographing spot). The top board 41 is driven by the couch controller 5 to move in its lengthwise direction and in an up-and-down direction. Usually, the couch 4 is installed so that its lengthwise direction is parallel to the central axis of the static field magnet unit 1.

The transmitting RF coil 6 is placed inside the gradient coil 2 and generates a radio-frequency magnetic field in response to application thereto of a radio-frequency pulse from the transmitter 7.

The transmitter 7 has an oscillator, a phase selector, a frequency converter, an amplitude modulator, a radio-frequency power amplifier, etc., built in. The oscillator generates a radio-frequency signal of a resonant frequency specific to nuclei under examination in a static magnetic field. The phase selector selects the phase of the radio-frequency signal. The frequency converter converts the frequency of a radio-frequency signal output from the phase selector. The amplitude modulator modulates the amplitude of the radio-frequency signal from the frequency converter in accordance with, say, a sync function. The radio-frequency power amplifier amplifies a radio-frequency signal output from the amplitude modulator. As the result of the operation of each component, the transmitter 7 transmits radio-frequency pulses corresponding to Larmor frequency to the transmitting RF coil 6.

The receiving RF coil 8 is placed inside the gradient coil 2 and adapted to receive magnetic resonance signals emitted from the subject under examination subjected to the radio-frequency magnetic field. The output signal from the receiving RF coil 9 is applied to the receiver 9.

The receiver 9 produces magnetic resonance signal data on the basis of the output signal of the receiving RF coil 8.

The computer system 10 includes an interface unit 101, a data collector 102, a reconstruction unit 103, a storage 104, a display 105, an input device 106, and a main controller 107.

The interface unit 101 is connected with the gradient power supply 3, the couch controller 5, the transmitter 7, the receiving RF coil 8, and the receiver 9 and allows signals to be transferred between each of these components and the computer system 10.

The data collector 102 collects digital signals output from the receiver 9 via the interface unit 101 and then stores the collected digital signals, i.e., magnetic resonance signal data, in the storage 104. At the time to collect data for calculating the amount of correction of a static magnetic field, the data collector 102 collects magnetic resonance signal data concerning the inside of a region of interest (ROI) under the control of the controller 104. Thus, the data collector 102 forms collection means together with the controller 104.

The reconstruction unit 103 performs postprocessing, that is, reconstruction such as Fourier transforms, on magnetic resonance signal data stored in the storage 104 to obtain spectrum data from desired nuclear spins within the subject under examination 200 or image data.

The storage 104 stores magnetic resonance signal data and spectrum data or image data for each patient.

The display 105 displays various information, such as spectrum data or image data, under the control of the main controller 107. As the display 105, a display device, such as a liquid crystal display, is available.

The input device 106 receives various commands and information from an operator and is equipped with a pointing device, such as a mouse or trackball, a select device, such as a mode changeover switch, and an device, such as a keyboard.

The main controller 107 is equipped with a CPU and a memory though not shown and controls each component of the MRI apparatus of this embodiment. In addition to the function of controlling known operations of the MRI apparatus, the main controller 107 has the following functions unique to this embodiment. One of the functions is to extract, from magnetic resonance signal data collected from an ROI, data reflecting the distribution of static field strength within a specific region which is defined in only part of that ROI. Another function is to calculate the amount of correction for correcting nonuniformity in the static magnetic field on the basis of the extracted data. Still another function is to control a correction coil to generate a correction magnetic field in accordance with the correction amount. A further function is to input information to define a specific region through the input device 106.

The operation of the MRI apparatus thus configured will be described hereinafter.

The operations of obtaining diagnostic images in this MRI apparatus may be identical to hitherto known ones. In obtaining diagnostic images, nonuniformity in a static magnetic field generated by the static field magnet 11 is corrected by a correction magnetic field generated by the correction coil 12. For this reason, the main controller 107 determines the amount of correction in the following manner prior to the operations of obtaining a diagnostic image. Note here that the amount of correction refers to the strength of a correction magnetic field for correcting the nonuniformity in the static magnetic field generated by the static field magnet 11.

FIG. 2 is a flowchart illustrating the procedure of the main controller 107 to calculate the amount of correction.

In step Sa1, the main controller 107 drives each component so as to collect magnetic resonance signal data reflecting a distribution of the strength of a static magnetic field generated by the static field magnet 11. At this time, the data is collected from a predetermined ROI. The ROI may be one that is preset in the MRI apparatus or one that is arbitrarily set by a user. The ROI, which includes at least a region for which an imaging diagnosis is to be made, is a space in the shape of a rectangular parallelepiped or a cube. In general, the ROI is set larger than a region for which an imaging diagnosis is to be made in order to prevent aliasing with respect to the readout and encoding directions.

In step Sa2, the main controller 107 creates a phase difference map for the entire ROI on the basis of the magnetic resonance signal data thus collected in the above manner. To create that phase difference map, the conventional technique to create a phase difference map for shimming can be used without modification.

In step Sa3, the main controller 107 extracts only data concerning a specific region from the phase difference map data. The specific region is set up only in part of the ROI. The setup of the specific region will be described later.

In step Sa4, the main controller 107 calculates the amount by which the static magnetic field is to be corrected on the basis of the extracted phase difference distribution data for the specific region.

A value of current to be applied to the correction coil 12 to generate a magnetic field corresponding to the correction amount thus calculated is determined according to the characteristics of the correction coil. The current value thus determined is applied to the correction coil 12 in collecting magnetic resonance signal data used to reconstruct an image for diagnosis.

Some of the specific region setup methods will be described below. Only one of the following methods may be employed restrictively. Alternatively, one of the methods may be selectively employed as instructed by the user.

(1) First Method

FIGS. 3A, 3B, and 3C and FIGS. 4A, 4B, and 4C illustrate a first method to set up a specific region.

Figure 3A:
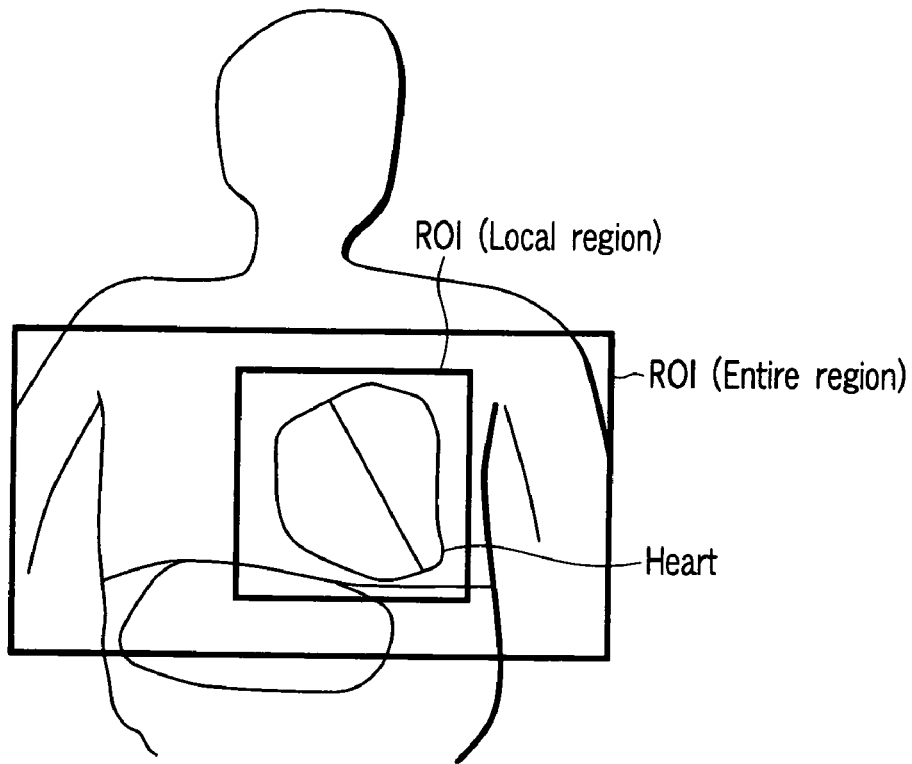
FIGS. 3A, 3B and 3C are diagrams for use in explanation of a first method to set up a specific region.
Figure 4A:
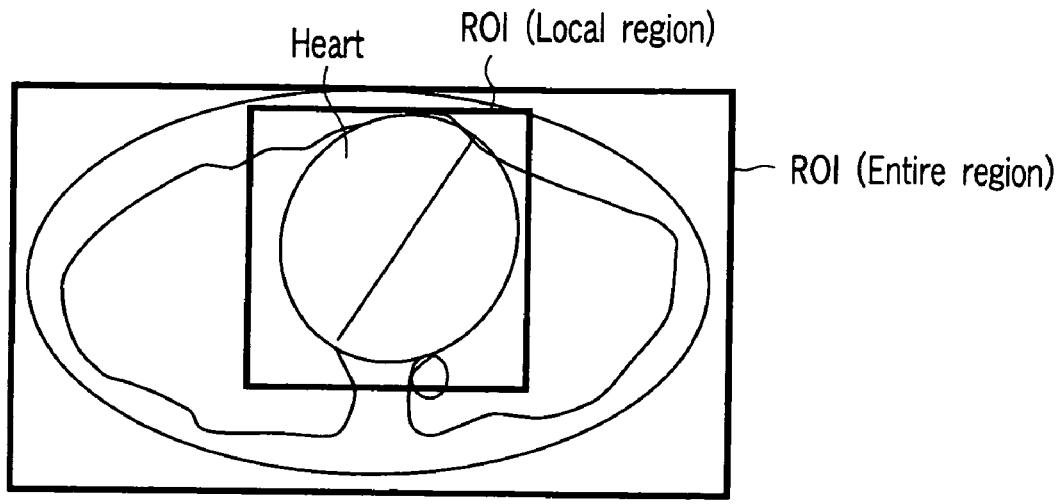
FIGS. 4A, 4B and 4C are diagrams for use in explanation of a first method to set up a specific region.

FIGS. 3A and 4A show ROI setup conditions in an axial plane and in a coronal plane. Although, as shown in FIGS. 3A and 4A, the entire region may be designated as the ROI, it is desired in this embodiment that a local region which is comprised of only an object for which a diagnostic image is to be obtained and its surrounding region be designated as the ROI. In FIGS. 3A and 4A, the heart region is designated as the ROI. As shown in FIGS. 3A and 4A, the ROI includes a breast wall portion in addition to the heart region. Such a thing can occur often.

Figure 3B:
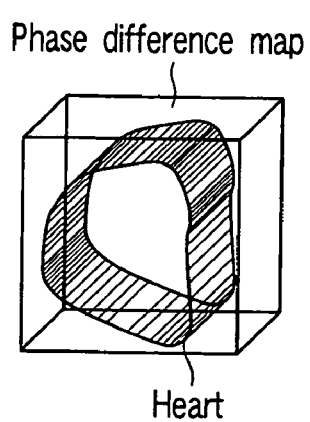
Figure 4B:
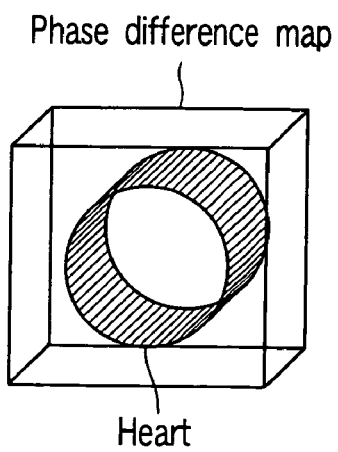

FIGS. 3B and 4B each show an example of a phase difference map associated with the ROI. Note that these figures show only the heart region.

Figure 3C:
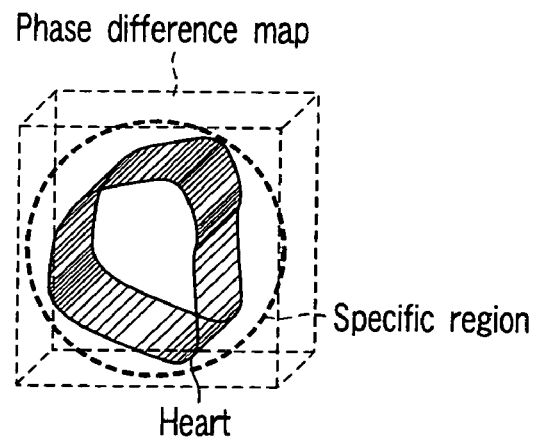
Figure 4C:
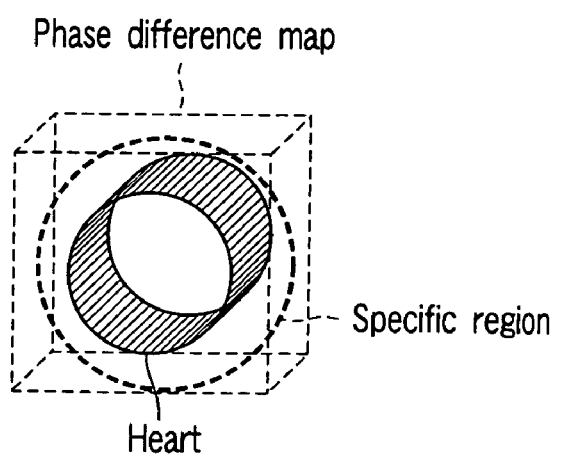

With the first method, a region having the shape of a sphere or ellipsoid that is inscribed with the phase difference map region and having a center almost coincide with that of the phase difference map region, is calculated as a specific region. FIGS. 3C and 4C show specific regions thus defined. In FIGS. 3C and 4C, the specific region has a circular shape because it is a sectional shape in a certain slice plane as shown in FIG. 5A. As shown in FIG. 5B, however, from one end of a slice to the other the circular shape progressively increases in size and then progressively decreases. In fact, therefore, the specific region has a spherical shape. In this example, since the ROI is cubic in shape, the specific region has a spherical shape. If the ROI is a rectangular parallelepiped, the specific region will have an oval shape. Data on the region outside the specific region in each slice plane, that is, the hatched region shown in FIG. 5B, are made invalid by zero-filling by way of example.

It is also possible to apply a specific region defined in the above manner to collected magnetic resonance signal data to thereby extract data within the specific region as shown in FIGS. 6A and 7A and then create a phase difference map associated with the specific region on the basis of the extracted data as shown in FIGS. 6B and 7B.

FIG. 3A shows a simplified image of the coronal section of the heat. The coronal section is more complicated than is shown in FIG. 3A. Therefore, it is more desired that the specific region in the coronal plane be a region of an combined ellipsoid formed by combining ellipses.

The coronal plane of the heart, for example, is asymmetrical at the upper part and the lower part. In view of this, a reference line is determined that divides the coronal plane into two sections, one for the upper part and the other for the lower part. Using the reference line as major or minor axis, two half ellipses are determined, which are inscribed by the aforementioned two regions. The two half ellipses re combined, forming an combined ellipsoid that represents a specified region in a slice plane. The reference line may be determined by the user or automatically determined by the main controller 107. The main controller 107 can determine a reference line, which will be used to determining the combined ellipsoid, by determine a provisional reference line at a position a little off the center of the ROI toward the lower part of the coronal plane, and then adjusting the position of the provisional reference line in response to a user instruction. To determine a reference line, the main controller 107 may find the broadest region of the organ (e.g., heart) on the basis of the pixel values of image data (intensity data). The line thus found is used as reference line. The combined ellipsoid can be determined by another method, first by forming two ellipses each having two foci designated by the user and then by combining the two ellipses thus formed.

(2) Second Method

In the second method, the main controller 107 prompts the user to, on the basis of such a three-dimensional image as shown in FIG. 8A, specify specific region limits for slice planes as shown in FIG. 8B. In this case, the user is allowed to specify specific region limits for each slice plane or specify specific region limits for both ends of a slice and an arbitrary number of intermediate slice planes. The main controller 107 defines a three-dimensional specific region on the basis of the specified regions while performing linear interpolation as necessary. Data on the region outside the specific region in each slice plane, i.e., the hatched region shown in FIG. 8B, are made invalid by zero-filling by way of example.

The second method makes it possible to define a specific region of any shape without being limited to a sphere or ellipsoid.

The designation of specific region limits by the user may be accepted at the time of setting up an ROI.

(3) Third Method

The third method is the same as the second method in that the user is prompted to designate specific region limits for two or more slice planes and a specific region is then defined on the basis of the designated limits. In the third method, however, the user is prompted to designate only a number of points on the outline indicating specific region limits as shown in FIG. 9. To designate these points, the user is allowed to use a mouse pointer, for example. The main controller 107 connects the designated points with straight or curved lines to define specific region limits. Spline interpolation may be performed on the lines that connect the designated points.

According to the third method, the user simply designates some points, which allows the burden on the user to be lightened in comparison with the second method. (4) Fourth Method The fourth method is the same as the second method in that the user is prompted to designate specific region limits for two or more slice planes and a specific region is then defined on the basis of the designated limits. In the fourth method, however, the user is prompted to designate a seed point on an image based on magnetic resonance signal data collected for an ROI as shown in FIG. 10A. At this point, the user designates the seed point so that it is located within an object region to be diagnosed. The seed point can be designated using a mouse pointer by way of example. The main controller 107 detects the outline of the object region with reference to the seed point by means of image processing as shown in FIG. 10B. As the image processing, use may be made of the known region growing method.

According to the fourth method, the user simply designates one seed point, which allows the burden on the user to be lightened in comparison with the second and third methods.

In addition, the system may be configured so as to allow the user to designate a different seed point for each of separate object regions and define the limits of each object region as a specific region as shown in FIGS. 10A and 10B.

Furthermore, it is also possible to show the results of region growing calculations to the user and allow him or her to revise the limits of each slice plane.

The region growing method can detect a three-dimensional region on the basis of a three-dimensional image. It is therefore allowed to prompt the user to specify a seed point within a three-dimensional image and then directly detect a specific region through region growing processing.

According to the invention, as described above, data from regions which are not suited to an analysis of the distribution of strength of a static magnetic field within a region for which an imaging diagnosis is to be made are removed from all collected data, and hence the amount of correction proper to correct the nonuniformity of that static magnetic field can be determined on the basis of the distribution of its strength within that region. As a result, the static magnetic field within the region for which an imaging diagnosis is to be made can be made more exactly uniform and diagnostic images can be obtained with high definition.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus adapted to reconstruct an image associated with a subject placed in a static magnetic field on the basis of magnetic resonance signals emitted from the subject, said apparatus comprising:
   a collector which collects magnetic resonance signals emitted from a region of interest of the subject; and
   a correction magnetic field generator which generates a correction magnetic field to correct the nonuniformity of the static magnetic field on the basis of magnetic resonance signals which (a) are contained in the magnetic resonance signals collected by the collector, and (b) are emitted from within a specific smaller region which contains only a portion of the region of interest.

2. The magnetic resonance imaging apparatus according to claim 1, wherein the correction magnetic field generator generates the correction magnetic field on the basis of phase data represented by the magnetic resonance signals emitted from the specific region.

3. The magnetic resonance imaging apparatus according to claim 1, wherein the correction magnetic field generator further comprises:
   a magnetic field generator which generates a magnetic field different from the static magnetic field and adds it to the static magnetic field;
   an extraction unit which extracts the magnetic resonance signals emitted from within the specific smaller region from the magnetic resonance signals collected by the collector;
   a calculation unit which calculates the amount of correction to correct the nonuniformity of the static magnetic field on the basis of the magnetic resonance signals extracted by the extraction unit; and
   a controller which controls the magnetic field generator to generate a correction magnetic field corresponding to the amount of correction.

4. The magnetic resonance imaging apparatus according to claim 1, wherein:
the specific smaller region is the inside region of a sphere, ellipsoid or combined ellipsoid which is inscribed within the region of interest and has its center substantially at the center of the region of interest.

5. The magnetic resonance imaging apparatus according to claim 1, further comprising:
an input device adapted to input information for defining the specific smaller region in association with an image based on the magnetic resonance signals collected by the collector, and
wherein a region defined based on the information is used as the specific smaller region.

6. The magnetic resonance imaging apparatus according to claim 5, wherein:
the input device inputs information representing the outline of the specific smaller region, and the region inside the outline is used as the specific smaller region.

7. The magnetic resonance imaging apparatus according to claim 5, wherein:
the input device inputs information representing a plurality of discrete points on the outline of the specific smaller region, and
the inside region of the outline determined by interpolating the plurality of points is used as the specific smaller region.

8. The magnetic resonance imaging apparatus according to claim 5, wherein:
the input device inputs information representing a seed point within the specific smaller region, and
the extraction unit uses a region defined on the basis of the seed point by a region growing method as the specific smaller region.

9. The magnetic resonance imaging apparatus according to claim 1, wherein:
a three-dimensional regions, which is not a rectangular parallelepiped and is inherent in the region of interests, is used as the specific smaller region.

10. A magnetic resonance imaging apparatus which subjects a subject under examination placed in a static magnetic field to a radio-frequency magnetic field and gradient magnetic fields to collect magnetic resonance signals from the subject, said apparatus comprising:
a shim coil to correct nonuniformity of the static magnetic field;
a setup unit which sets up a three-dimensional region within the static magnetic field;
a measurement unit which measures the distribution of static magnetic field strength within the three-dimensional region set up by the setup unit; and
a calculation unit which calculates a value of current to be applied to the shim coil to correct nonuniformity of the static magnetic field in accordance with the magnetic field distribution measured by the measurement unit, within a spherical, elliptical or combined ellipsoid region contained within the three-dimensional region and constituting a sub-part thereof.

11. The magnetic resonance imaging apparatus according to claim 10, wherein:
the three-dimensional region is in the shape of a rectangular parallelepiped, and the spherical, elliptical or combined ellipsoid region is a smaller region that is inscribed within the rectangular parallelepiped region.

12. A magnetic resonance imaging apparatus which subjects a subject under examination placed in a static magnetic field to a radio-frequency magnetic field and gradient magnetic fields to collect magnetic resonance signals from the subject, said apparatus comprising:
a measurement unit which measures the distribution of static magnetic field strength;
an extraction unit which extracts the distribution of static magnetic field strength within a spherical, elliptical or combined ellipsoid sub-region from a larger region for which static magnetic field distribution has been measured by the measurement unit; and
a shimming unit which carries out shimming to increase uniformity of the static magnetic field in accordance with the sub-region magnetic field distribution extracted by the extraction unit.

13. For use with a magnetic resonance imaging apparatus in which a subject under examination from which magnetic resonance signals are to be collected is placed in a static magnetic field, a method of correcting the static magnetic field comprising:
collecting magnetic resonance signals emitted from a region of interest of the subject; and
generating a correction magnetic field to correct nonuniformity of the static magnetic field on the basis of magnetic resonance signals which (a) are contained in the collected magnetic resonance signals, and (b) are emitted from within a specific smaller region which forms only a portion of the region of interest.

14. For use with a magnetic resonance imaging apparatus in which a subject under examination placed in a static magnetic field is subjected to a radio-frequency magnetic field and gradient magnetic fields to collect magnetic resonance signals from the subject and a shim coil is set to correct nonuniformity of the static magnetic field, a method of correcting the static magnetic field comprising:
setting up a three-dimensional region within the static magnetic field;
measuring distribution of static magnetic field strength within the three-dimensional region; and
calculating a value of current to be applied to the shim coil to correct nonuniformity of the static magnetic fields in accordance with the measured magnetic field distribution, within a spherical or elliptical sub-region contained within the three-dimensional region.

15. For use with a magnetic resonance imaging apparatus which subjects a subject under examination placed in a static magnetic field to a radio-frequency magnetic field and gradient magnetic fields to collect magnetic resonance signals from the subject, a method of correcting the static magnetic field comprising:
measuring the distribution of static magnetic field strength;
extracting the distribution of static magnetic field strength within a spherical or elliptical sub-region from the measured static magnetic field distribution in a larger region; and
performing shimming to increase uniformity of the static magnetic field in accordance with the extracted magnetic field distribution within the spherical or elliptical sub-region.

* * * * *